United States Patent
Healy et al.

(10) Patent No.: US 11,853,498 B2
(45) Date of Patent: Dec. 26, 2023

(54) SYSTEM, METHOD, AND APPARATUS FOR PASSIVE SHIELDING OF A CAPACITIVE SENSING BUTTON

(71) Applicant: Cypress Semiconductor Corporation, San Jose, CA (US)

(72) Inventors: Mark Healy, Cork (IE); Daniel O'Keeffe, Whitechurch (IE)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 18/083,111

(22) Filed: Dec. 16, 2022

(65) Prior Publication Data

US 2023/0333686 A1 Oct. 19, 2023

Related U.S. Application Data

(63) Continuation of application No. 17/396,220, filed on Aug. 6, 2021, now Pat. No. 11,543,908.

(51) Int. Cl.
*G06F 3/041* (2006.01)
*G01R 27/26* (2006.01)
*G06F 3/044* (2006.01)

(52) U.S. Cl.
CPC ....... *G06F 3/0416* (2013.01); *G01R 27/2605* (2013.01); *G06F 3/0446* (2019.05); *G06F 2203/04107* (2013.01)

(58) Field of Classification Search
None
See application file for complete search history.

(56) References Cited

U.S. PATENT DOCUMENTS

| | | | |
|---|---|---|---|
| 11,543,908 B1 * | 1/2023 | Healy | G06F 3/0416 |
| 2022/0066592 A1 * | 3/2022 | Maharyta | G06F 3/0418 |

* cited by examiner

*Primary Examiner* — Stephen T. Reed (57) ABSTRACT

Apparatuses and methods of shielding for capacitance-to-digital code conversion are described. One apparatus includes a capacitance-to-digital converter (CDC) for measuring a self-capacitance of a sensor electrode. The capacitance-to-digital code converter can in a first phase, apply a supply voltage to the sensor electrode. The sensor electrode and a shield electrode, the form a mutual capacitance with the sensor electrode. The CDC, in a second phase, couples the shield electrode to a ground potential and the sensor electrode to a first modulation capacitor. The first modulation capacitor is pre-charged to a reference voltage. The CDC, in a third phase, couples the sensor electrode and the shield electrode to the ground potential. The CDC, in a fourth phase, couples the shield electrode to the ground potential and the sensor electrode to a second modulation capacitor. The second modulation capacitor is pre-charged to the reference voltage.

20 Claims, 13 Drawing Sheets

SYSTEM, METHOD, AND APPARATUS FOR PASSIVE SHIELDING OF A CAPACITIVE SENSING BUTTON

CROSS-REFERENCE TO RELATED APPLICATION

This application is a Continuation of U.S. patent application Ser. No. 17/396,220, filed on Aug. 6, 2021, which is incorporated herein in its entirety.

TECHNICAL FIELD

The present disclosure relates generally to sensing systems, and more particularly to capacitance-sensing systems configurable to measure capacitance or convert capacitance to digital values representative of the capacitance.

BACKGROUND

Capacitance sensing systems can sense electrical signals generated on electrodes that reflect changes in capacitance. Such changes in capacitance can indicate a touch event (i.e., the proximity of an object to particular electrodes). Capacitive sense elements may be used to replace mechanical buttons, knobs and other similar mechanical user interface controls. The use of a capacitive sense element allows for the elimination of complicated mechanical switches and buttons, providing reliable operation under harsh conditions. In addition, capacitive sense elements are widely used in modern customer applications, providing new user interface options in existing products. Capacitive sense elements can range from a single button to a large number arranged in the form of a capacitive sense array for a touch-sensing surface.

Arrays of capacitive sense elements work by measuring the capacitance of a capacitive sense element, and looking for a delta (change) in capacitance indicating a touch or presence of a conductive object. When a conductive object (e.g., a finger, hand, or other object) comes into contact with or close proximity to a capacitive sense element, the capacitance changes and the conductive object is detected. The capacitance changes of the capacitive touch sense elements can be measured by an electrical circuit. The electrical circuit converts the measured capacitances of the capacitive sense elements into digital values.

There are two typical types of capacitance: 1) mutual capacitance where the capacitance-sensing circuit is coupled to both electrodes of the capacitor and a drive/receive configuration measures capacitance between them; 2) self capacitance where the capacitance-sensing circuit is coupled to a single electrode of the capacitor where the second electrode is tied to a DC voltage level or is parasitically coupled to Earth Ground. A touch panel has a distributed load of capacitance of both types (1) and (2) and some touch solutions sense both capacitances either uniquely or in hybrid form with its various sense modes.

SUMMARY

In many consumer applications, there is a demand for touch sensors, for example, in screens, buttons, and the like, that are responsive to conductive sources that are touching and/or proximate to the sensor. However, these sensors are sensitive to additional conductive sources, such as water, which may generate undesirable sensor responses or which may interfere with intended sensor responses. In many cases, these sensors include a sensor pad that is surrounded by a hatched ground plane (e.g., hatched or patterned conductions that are electrically coupled to a ground potential). The hatched ground plane can help reduce interference from external noise sources while minimizing parasitic capacitances (compared to having a solid ground plane) when a sensor capacitance is coupled to the ground potential.

However, even with the hatched ground plane, the parasitic capacitances, although reduced, still degrade the sensitivity of the capacitance sensor. Other sources of interference, such as liquid droplets, can further affect the system by modulating the parasitic capacitance with the sensor capacitance, which can result in false capacitance-sensing measurements that are as large or on the order of intended capacitance-sensing measurements. In other words, unintended sources can affect capacitance-sensing systems and generate significant results on capacitance-sensing measurements.

Aspects of the present invention address the abovementioned and other deficiencies by providing a system and method to drive the hatched ground plane with a shield signal. The shield signal has the same polarity but different amplitudes compared the voltage signal of the sensor, which serves to maintain the parasitic capacitances at a zero voltage, which can remove their effect on the touch-sensing system.

There are a number of advantages of the present invention for passive shielding. For example, there is no need for an active component such as shield buffers or comparators, which can reduce overall power consumption. Further since there is no shield buffer, which limits capacitance size ranges due to stability requirements, there is no such limitation. The speed of the shielding is limited only by general purpose input/output (GPIO) "on" resistance. Further there is no need for a reference voltage (VREF).

In one embodiment, a system includes a capacitance-to-digital converter that can measure a self-capacitance of a sensor electrode. The shield electrode forms a mutual capacitance with the sensor electrode. The capacitance-to-digital converter can sequence through four phases. In a first phase, the capacitance-to-digital converter can apply a supply voltage to a sensor electrode and a shield electrode. In a second phase, the capacitance-to-digital converter can couple the shield electrode to a ground potential. The capacitance-to-digital converter can couple the sensor electrode to a first modulation capacitor, which is pre-charged to a reference voltage. In a third phase, the capacitance-to-digital converter can couple the sensor electrode and the shield electrode to the ground potential. In the fourth phase, the capacitance-to-digital converter can couple the shield electrode to the ground potential and the sensor electrode to a second modulation capacitor, which is pre-charged to the reference voltage.

DETAILED DESCRIPTION

Figure 1A:
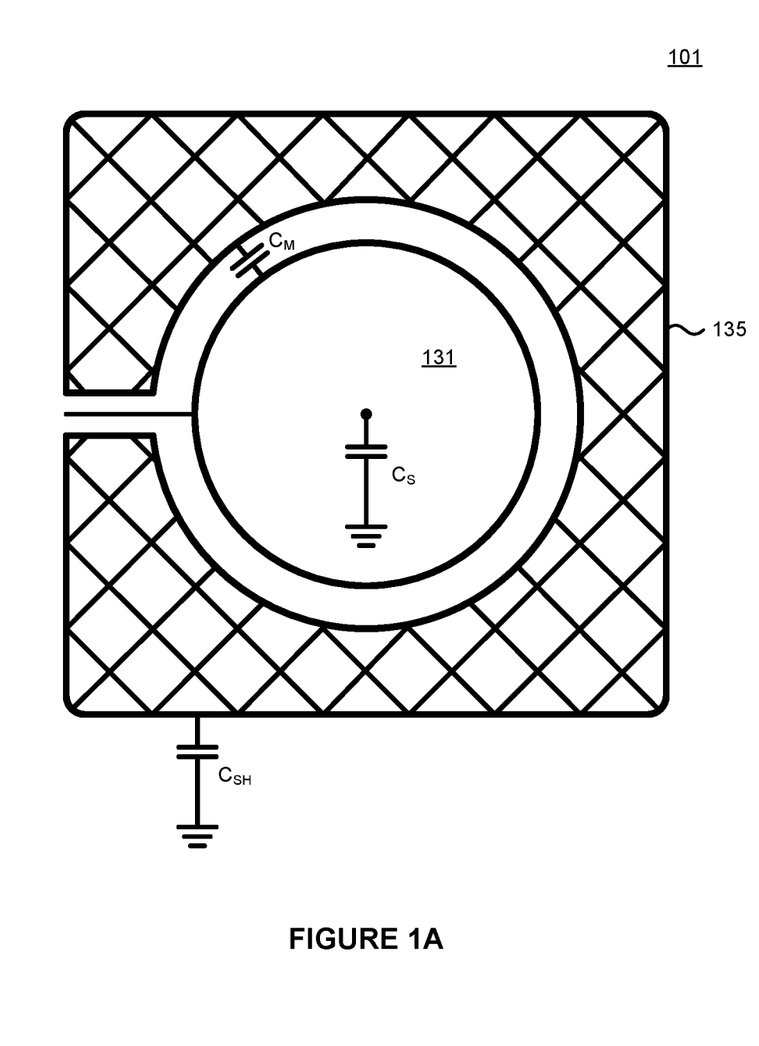
FIG. 1A illustrates an embodiment of a capacitance sensing button of a sensor electrode that is surrounded by a hatched plane.

FIG. 1A illustrates an embodiment of a capacitance sensing button 101 of a sensor electrode 131 that is surrounded by a hatched plane 135. Sensor electrode 131 may have a self-capacitance to ground, CS. Hatched plane 135 may be a ground plane or a shield electrode. If configured as a shield electrode, hatched plane 135 may have a capacitance to ground, CSH. Finally, the border between sensor electrode 131 and shield electrode 135 may form a mutual capacitance CM. Although capacitance sensing button 101 is illustrated as being surrounded by a hatched plane, in other embodiments, a capacitance sensing button may be surrounded by a solid ground plane and/or used for touchscreens. The methods and apparatuses described herein can be applied to other touch-based technologies such as touch screens.

Figure 1B:
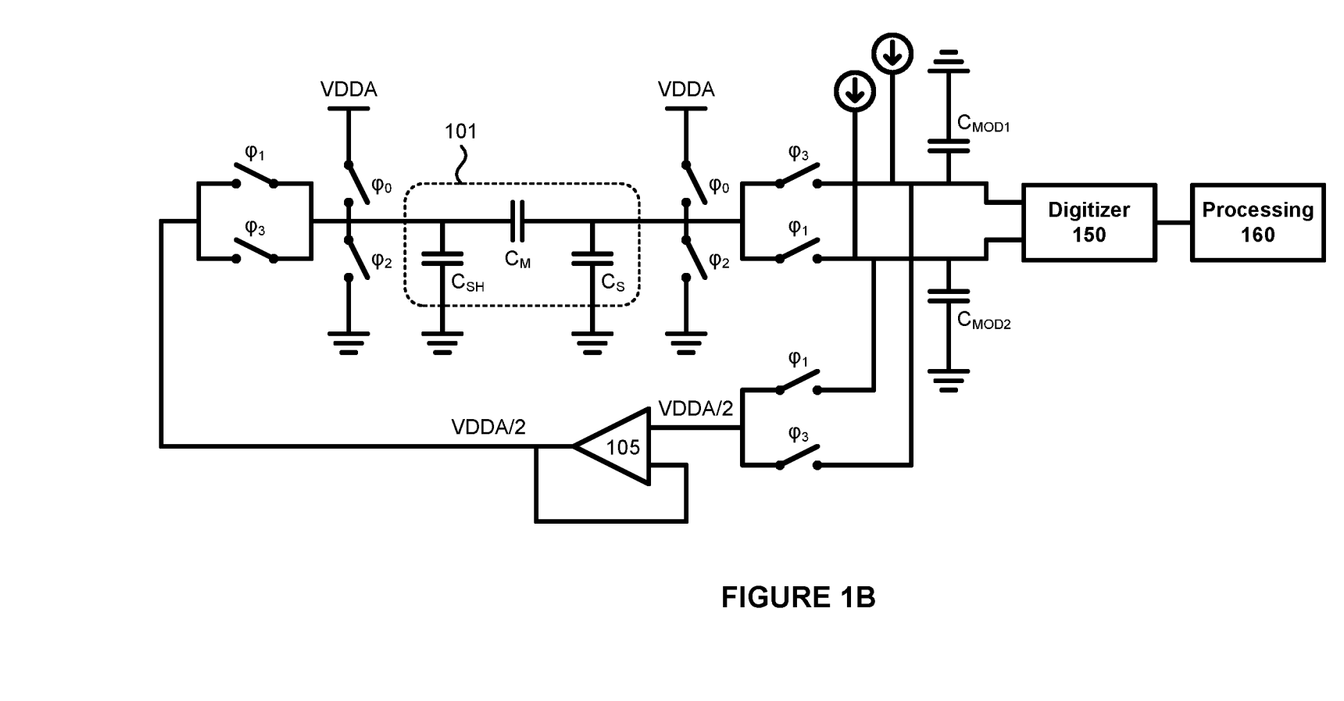
FIG. 1B is a capacitance-to-digital converter (CDC) circuit with an active shield and a buffer to provide the active shield voltage, according to an embodiment.

FIG. 1B illustrates a capacitance-to-digital conversion circuit including an active shield with circuitry for maintaining a voltage across the shield electrode (forming shield capacitance CSH) at the same voltage as is across a sensor electrode (forming sensor capacitance CS). There may exist a mutual capacitance (CM) between the shield electrode and the sensor electrode. Sensor capacitance CS may be connected to a pair of differential inputs of a digitizing circuit 150, which may provide a digital value representative of the sensor capacitance CS to a processing unit 160. CS may be connected to a first differential input in one phase and to a second differential input in another phase. Each differential input may also be connected to a modulation capacitor (CMOD1 and CMOD2). The differential input and the modulation capacitors may also be coupled to a pair of current sources (positive and negative) for adding and removing charge from at least the modulation capacitors.

Digitizing circuit 150 may measure the amount of time necessary to return a voltage across the modulation capacitors to a reference voltage after the sensor capacitance and parasitic capacitance are coupled in parallel with the modulation capacitors and charge is added or subtracted thereto. The amount of time necessary to return the voltage on the modulation capacitors may be representative of the sensor capacitance CS.

In one embodiment, circuitry may be provided to ensure that the voltage across CM is zero. In this embodiment, the voltage on the shield electrode is maintained at the same level as the voltage on the sensor electrode. In this embodiment, switches may be provided to both a supply voltage (VDDA) and ground as well as to a reference voltage (VDDA/2). To provide the reference voltage, buffer 105 may be used to ensure that the shield electrode does not erroneously change the capacitance or voltage across CMOD1 or CMOD2.

Figure 1C:
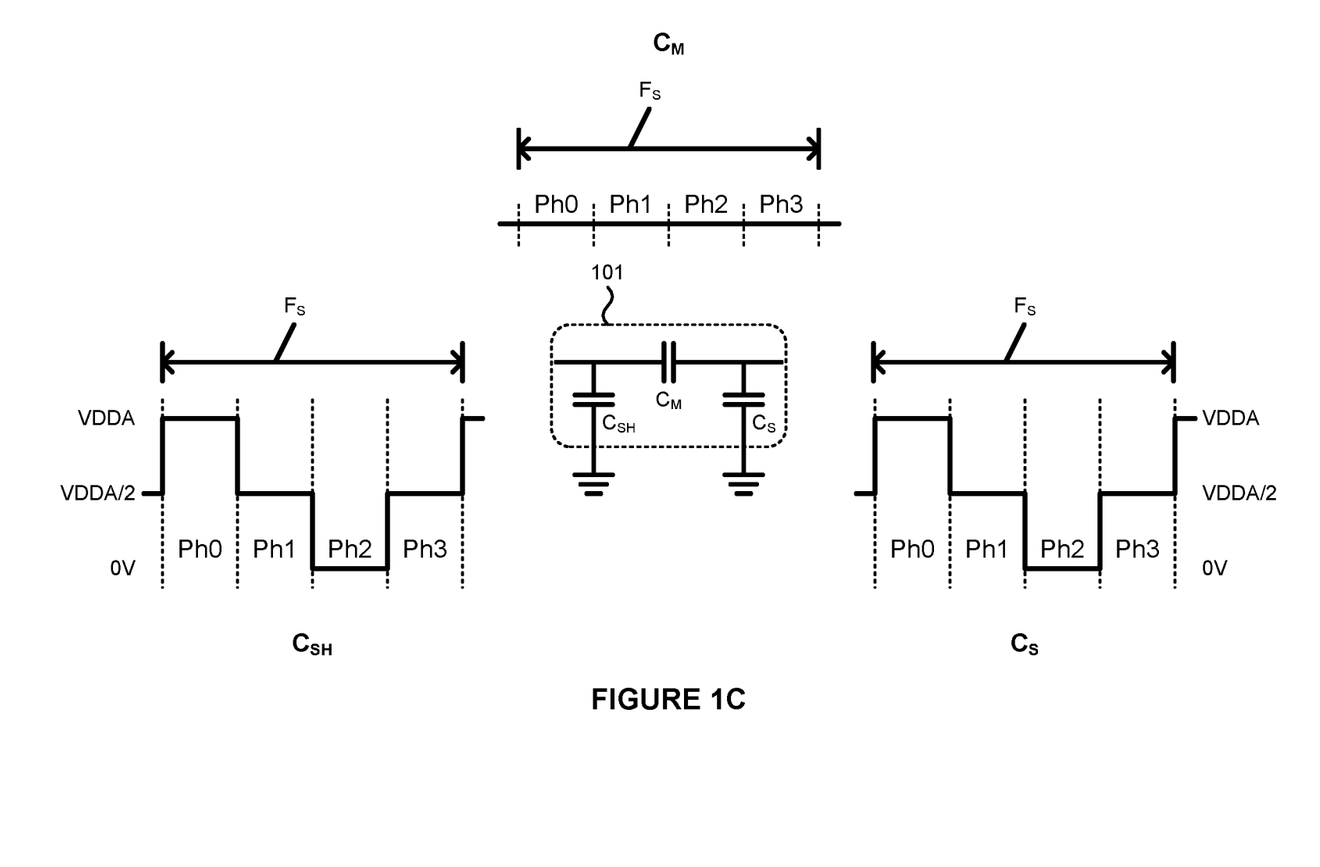
FIG. 1C is a representation of capacitances around a sensor capacitance and voltages applied to them during phases of operation of the CDC FIG. 1B, according to an embodiment.

FIG. 1C illustrates the capacitances (illustrated as element 101 in FIGS. 1A and 1B) and the voltage signals applied to each during each phase of operation of the capacitance-to-digital converter. Capacitance-to-digital conversion may comprise four phases ($\varphi_0$-$\varphi_3$) that occur within a time FS. The phases illustrated in FIG. 1C may correspond to the labelled switches of FIG. 1B.

In an initial phase ($\varphi_0$) the shield electrode and the sensor electrode (forming shield capacitance CSH and CS, respectively), are each connected to VDDA. The resulting voltage across the mutual capacitance formed between the shield and sensor electrodes is therefore zero. In the next phase ($\varphi_1$), the sensor electrode may be connected to CMOD2, which was previously connected to a reference voltage VDDA/2. The shield electrode may also be connected to VDDA/2 through the output of buffer 105. In $\varphi_1$, therefore, the voltage across the mutual capacitance formed between the shield and sensor electrodes is therefore zero. It is worth noting that the modulation capacitors CMOD1 and CMOD2 may act as passive integrators. In other embodiments, the modulation capacitors may be driven by active integrators. In $\varphi_2$, the shield electrode and the sensor are each connected to ground and the mutual capacitance formed between them is zero. Finally, in $\varphi_3$, the sensor electrode may be connected to CMOD1, which was previously connected to a reference voltage VDDA/2. The shield electrode may also be connected to VDDA/2 through the output of buffer 105. In $\varphi_3$, therefore, the voltage across the mutual capacitance formed between the shield and sensor electrodes is therefore zero. In some embodiments, the phases can occur in a different order. In some embodiments the phases $\varphi_0$ and $\varphi_2$ may be switched with each other.

In all phases, the potential on both sides of the parasitic (mutual) capacitor formed between the shield electrode and the sensor electrode is connected to the same voltage potential, resulting in no charge accumulating on the parasitic (mutual) capacitor. It is worth noting that when the shield capacitance is grounded, the mutual capacitance may be added to the conversion, since it is coupled to CMOD1 and CMOD2 with CS. In this configuration, the parasitic (mutual) capacitance may change the measured capacitance and reduce the precision of the measurement of the capacitance (CS) of the sensor electrode to ground.

Figure 2A:
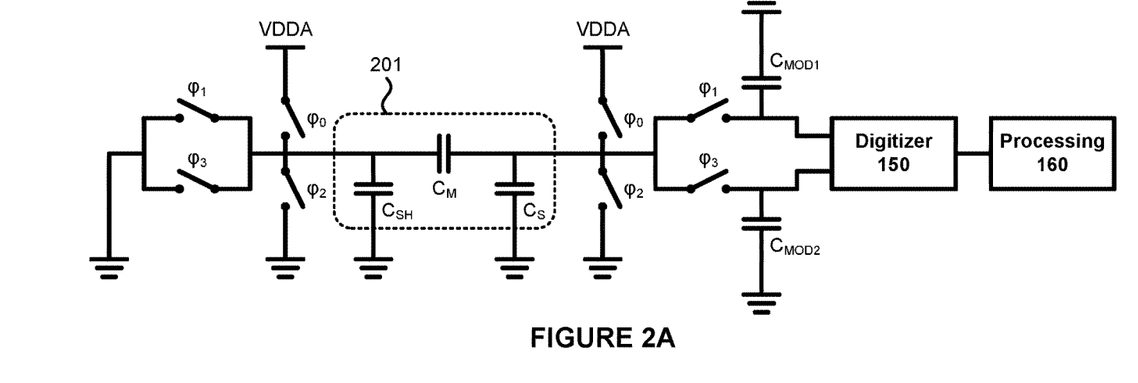
FIG. 2A is a CDC circuit with passive shield and without a buffer, according to an embodiment.

FIG. 2A illustrates one embodiment of a circuit for digitizing sense capacitance (CS) on a sensing capacitor using passive shield to remove the shield capacitance (CSH) and mutual capacitance (CM) from the measurement.

In an initial phase ($\varphi_0$) a voltage (VDDA) is connected to both the shield electrode and the sensor electrode. The voltage across the CM is therefore zero. The voltage across CSH and CS is VDDA. Both modulation capacitors, when not connected to CS, are connected to VDDA/2. In the next phase ($\varphi_1$) the shield electrode is shorted to ground and the sensor electrode is connected to a first modulation capacitor (CMOD1). The voltage across CSH is then zero and the voltage across CM and CS is approximately VDDA/2. The voltage on CM, CS, and CMOD1 will not be precisely VDDA/2, since the charge stored on CS is shared with the three capacitors in parallel and some charge is shared with CM. But since CMOD1 and CMOD2 are orders of magnitude larger than CM and CS, the actual voltage change may be negligible. In the next phase ($\varphi_2$), the shield electrode and the sensor electrode are both connected to ground. The voltage across CM is therefore zero. In the final phase ($\varphi_3$), the shield electrode remains shorted and the voltage across CM and CS is approximately VDDA/2.

Figure 2B:
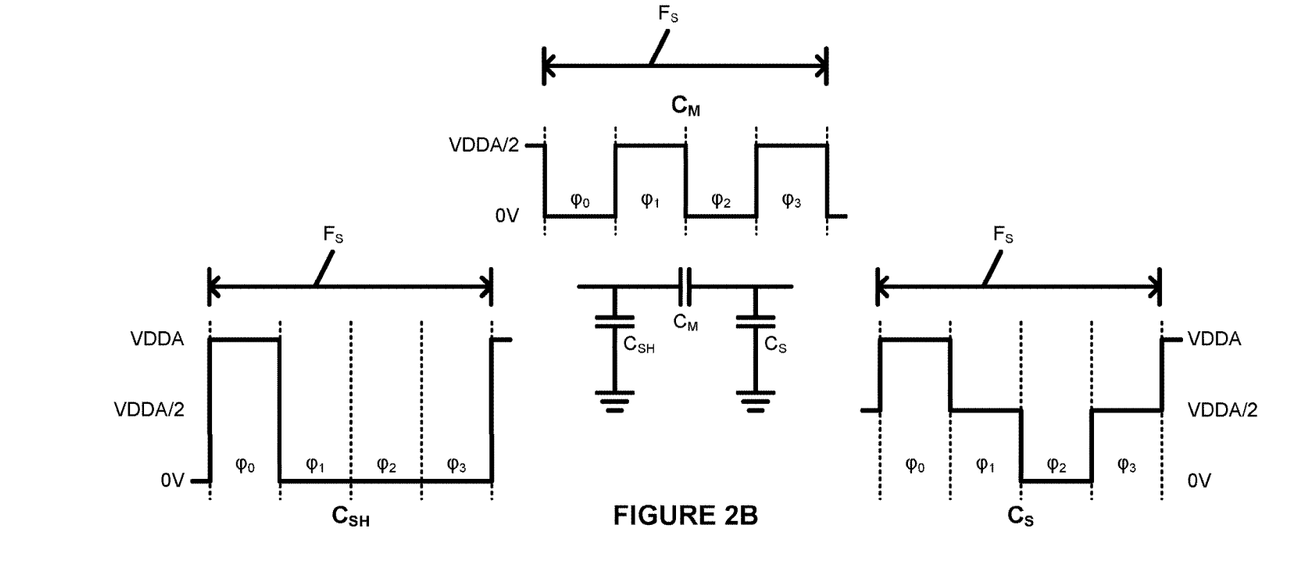
FIG. 2B is a representation of capacitances around a sensor capacitance and voltages applied to them during phases of operation of the CDC of FIG. 2A, according to an embodiment.

FIG. 2B illustrates the capacitances (illustrated as element 201 in FIG. 2A) and the voltage signals applied to each during each phase of operation of the capacitance-to-digital converter. Capacitance-to-digital conversion may comprise four phases ($\varphi_0$-$\varphi_3$) that occur within a time FS. The phases illustrated in FIG. 2B may correspond to the labelled switches of FIG. 2A.

In an initial phase ($\varphi_0$) the shield electrode and the sensor electrode (forming shield capacitance CSH and CS, respectively), are each connected to VDDA. The resulting voltage across the mutual capacitance formed between the shield and sensor electrodes is therefore zero. In the next phase ($\varphi_1$), the sensor electrode may be connected to CMOD2, which was previously connected to a reference voltage VDDA/2. The shield electrode may also be coupled to ground, creating a voltage potential across the parasitic (mutual) capacitor formed between the shield and sensor electrodes (CM) of VDDA/2. In $\varphi_2$, the shield electrode and the sensor are each coupled to ground and the voltage across the mutual capacitance is zero. Finally, in $\varphi_3$, the sensor electrode may be connected to CMOD1, which was previously connected to a reference voltage VDDA/2. The shield electrode may be coupled to ground, creating a voltage potential across the parasitic (mutual) capacitor formed between the shield and sensor electrodes (CM) of VDDA/2.

In this configuration, the parasitic (mutual) capacitance of the mutual capacitor formed between the shield electrode and the sensor electrode is added to both the digitization of the sensor capacitance (CS) as is added to CMOD1 and removed from CMOD2. Since CM is added to both, its differential input is cancelled out and the parasitic capacitance does not add to the capacitance that is digitized by the digitizer block and sent to the processor block.

Figure 2C:
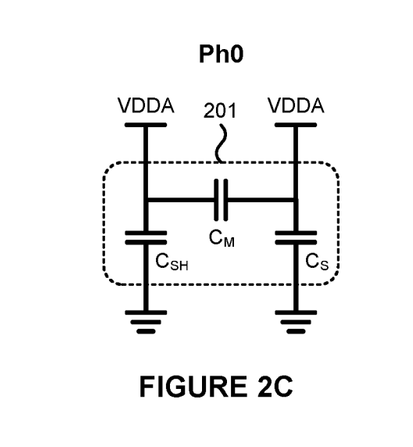
FIGS. 2C-F are illustrations of the connections of each of the capacitances during phases of operation of the CDC of FIG. 2A, according to an embodiment.

FIGS. 2C-F illustrate the connections to each of the electrodes during $\varphi_0$-$\varphi_3$. FIG. 2C shows that both the shield and sensor electrode are coupled to VDDA. The mutual capacitor formed between them has a voltage potential of zero. Neither CMOD1, nor CMOD2, is connected to the sensor electrode.

Figure 2D:
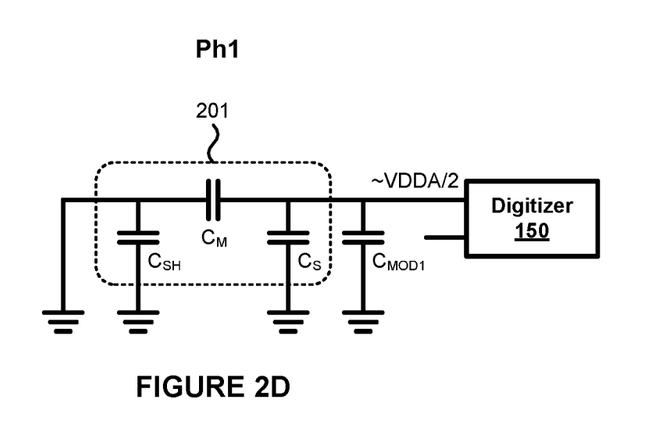
Figure 2E:
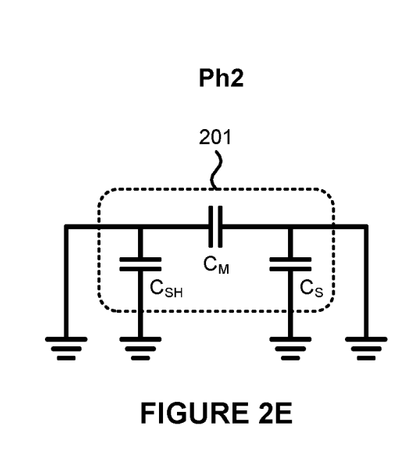
Figure 2F:
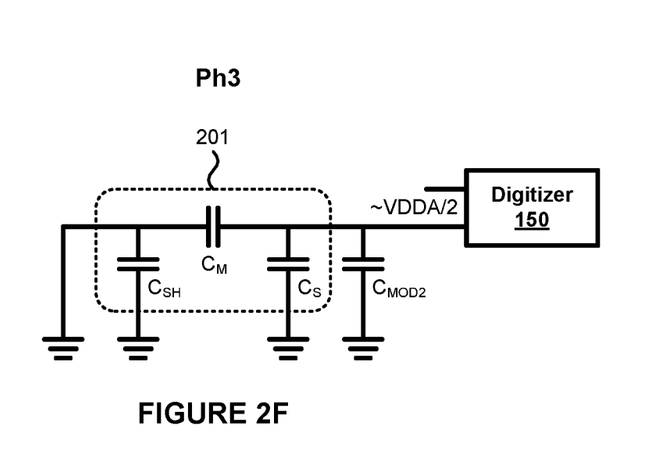

FIG. 2D shows that the shield electrode is connected to ground, while the sensor electrode is connected CMOD1, which was previously connected to VDDA/2. CMOD1 is also connected to an input of digitizing circuit 150. There is therefore a non-zero voltage potential across CM. CS adds charge to the circuit including CMOD1, CS, and CM. CM removes charge from the circuit.

FIG. 2C shows that both the shield and sensor electrode are coupled to ground. The mutual capacitor formed between them has a voltage potential of zero. Neither CMOD1, nor CMOD2, is coupled to the sensor electrode.

FIG. 2D shows that the shield electrode is coupled to ground, while the sensor electrode is coupled CMOD1, which was previously coupled to VDDA/2. CMOD2 is also coupled to an input of digitizing circuit 150. There is therefore a non-zero voltage potential across CM. Both CS and CM remove charge from the circuit including CMOD1, CS, and CM.

Figure 2G:
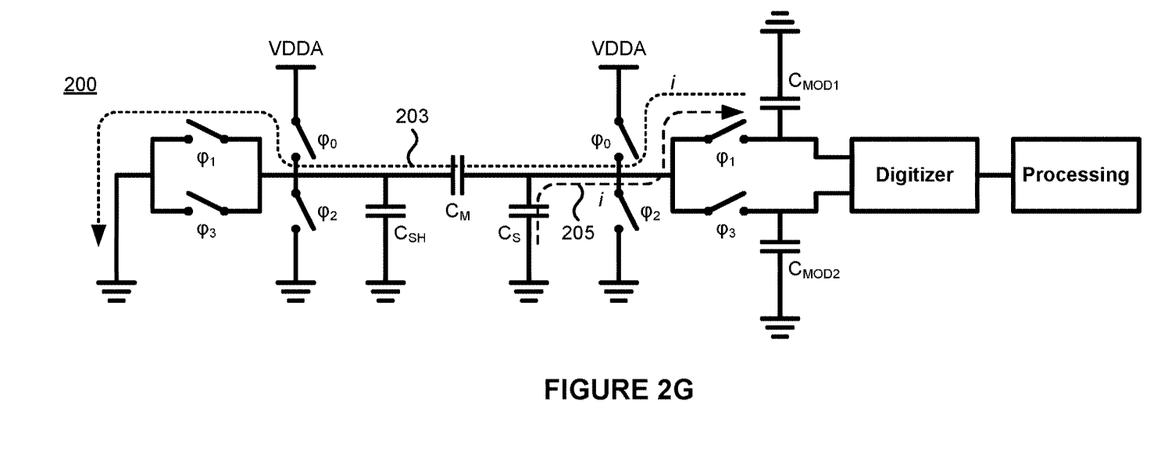
FIGS. 2G-H are illustration of the movement of charge to and from modulation capacitors during phases of operation of the CDC of FIG. 2A, according to an embodiment.
Figure 2H:
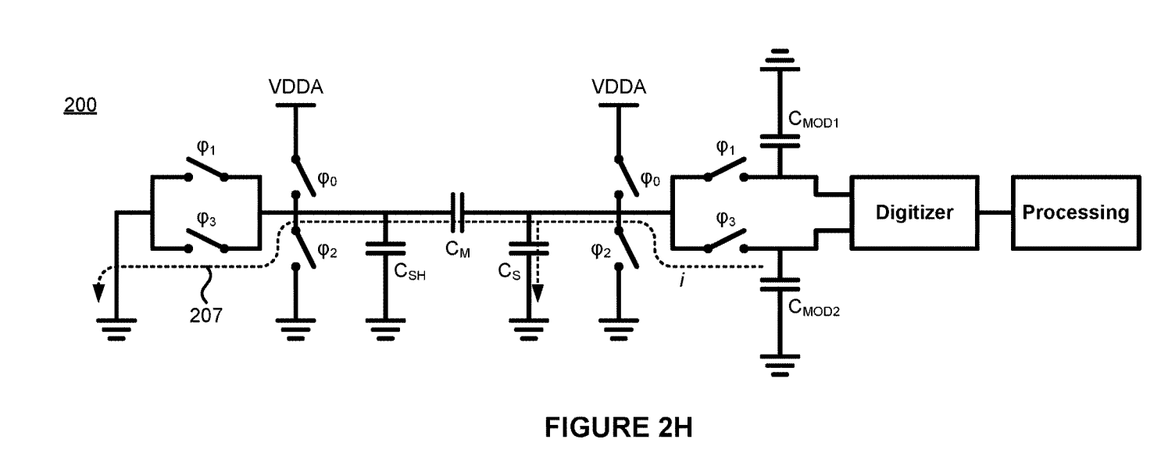
Figure 2I:
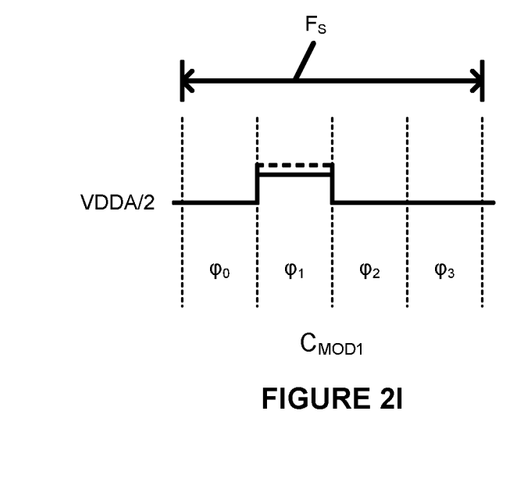
FIGS. 2I-J are illustrations of voltages on the modulation capacitances during phases of operation of the CDC of FIG. 2A, according to an embodiment.
Figure 2J:
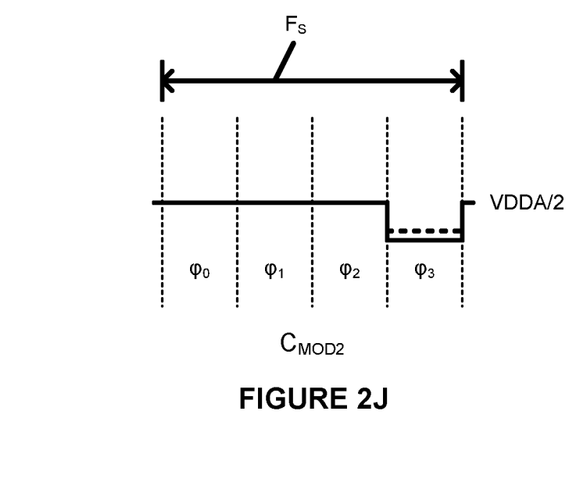

FIGS. 2I and 2J illustrate the resulting voltage on CMOD1 and CMOD2 during the different phases of operation, $\varphi_0$-$\varphi_3$. In FIG. 2I, CMOD1 is connected to VDDA/2 in $\varphi_0$. In $\varphi_1$, charge is added by CS and removed by CM. The dotted line indicates the voltage that would exist with only the charge added by CS. The solid line is the actual voltage, including the charge added by CS as well as the charge removed by CM. During $\varphi_2$-$\varphi_3$, CMOD1 is connected to VDDA/2.

In FIG. 2J, CMOD2 is connected to VDDA/2 in $\varphi_0$-$\varphi_2$. In $\varphi_3$, charge is removed by both CS and CM. The dotted line indicates the voltage that would exist with only the charge removed by CS. The solid line is the actual voltage, including the charge removed by CM.

FIGS. 2G and 2H illustrate the movement of charge, i, from CS and CM onto CMOD1 and CMOD2 according to the embodiments described in FIGS. 2A and 2B. For CMOD1, CS adds charge 205 to CMOD1, having accumulated it by being connected to VDDA in $\varphi_0$. CM removes charge from CMOD1 as its potential was 0V in $\varphi_0$. In $\varphi_3$, both CM and CS remove charge (lower the voltage across) CMOD2 as both the shield and sensor electrodes were coupled to ground in $\varphi_2$, meaning that their voltage potential was zero. In some embodiments, the movement of charge as described can cause a drift of the common-mode towards the ground electrode of the modulation capacitors, CMOD1 and CMOD2. This can be mitigated by alternatively applying an equivalent common-mode drift to the VDDA electrode and the ground electrode at the sensor clocking frequency FS. This has the effect of canceling out the drift in the common-mode noise. The capacitance-to-digital converter of FIG. 3A is one example of a capacitance-to-digital converter to cancel out common-mode noise drift, as described below.

Figure 3A:
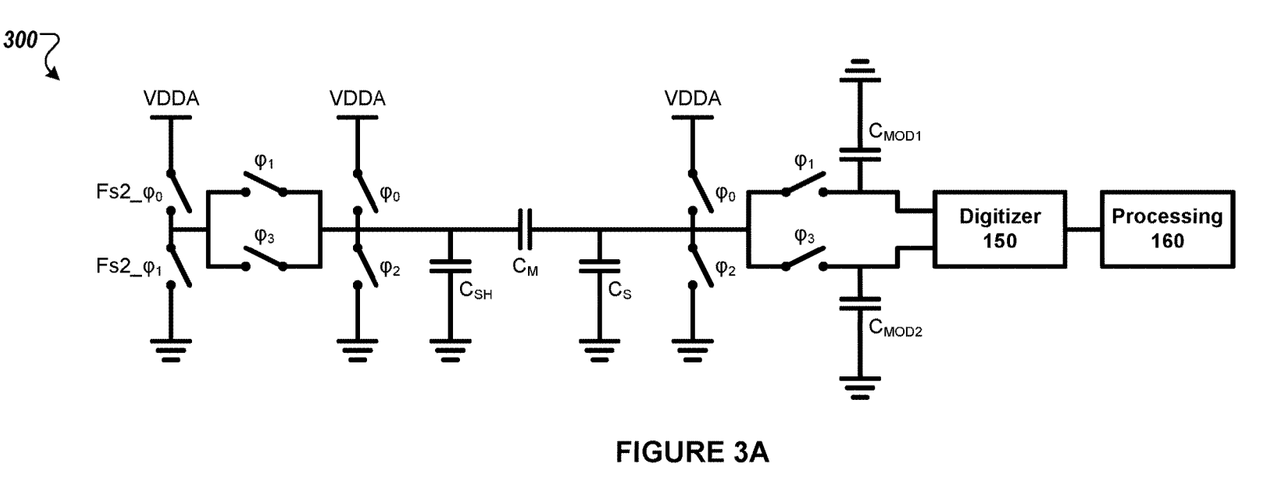
FIG. 3A is a CDC with positive and negative cancelling of parasitic capacitance using switches, according to an embodiment.
Figure 3B:
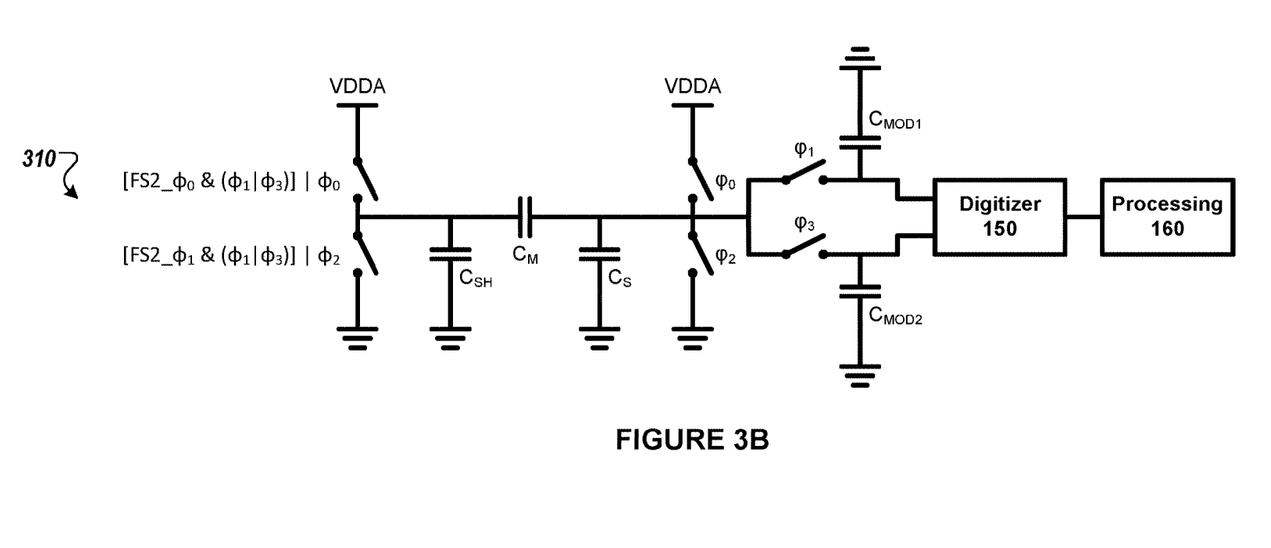
FIG. 3B is a CDC with positive and negative cancelling of parasitic capacitances using logic and/or firmware, according to an embodiment.

FIG. 3A illustrates an embodiment of a capacitance-to-digital converter 300, wherein the connections of the shield electrode are coupled to either VDDA or ground in alternating periods (FS). In this embodiment, common mode level shifting to VDDA and ground is cancelled out over a period of 2FS. As capacitance-to-digital circuit 300 goes through $\varphi_0$-$\varphi_3$ as described above with regard to FIGS. 2A-J, every other cycle through $\varphi_0$-$\varphi_3$ couples the shield electrode to either VDDA or ground with control signals FS2_$\varphi_0$ and FS2_$\varphi_1$. In the embodiment of FIG. 3B, a capacitance-to-digital converter 310 allows for control of voltages coupled to the shield electrode is achieved with logic or firmware executed by a microcontroller. This reduces the number of switches but increases the processing bandwidth as voltage control by signals [FS2_$\varphi_0$ & ($\varphi_1$|$\varphi_3$)]|$\varphi_0$ and [FS2_$\varphi_1$ & ($\varphi_1$|$\varphi_3$)]|$\varphi_2$ are applied by the microcontroller.

Figure 4:
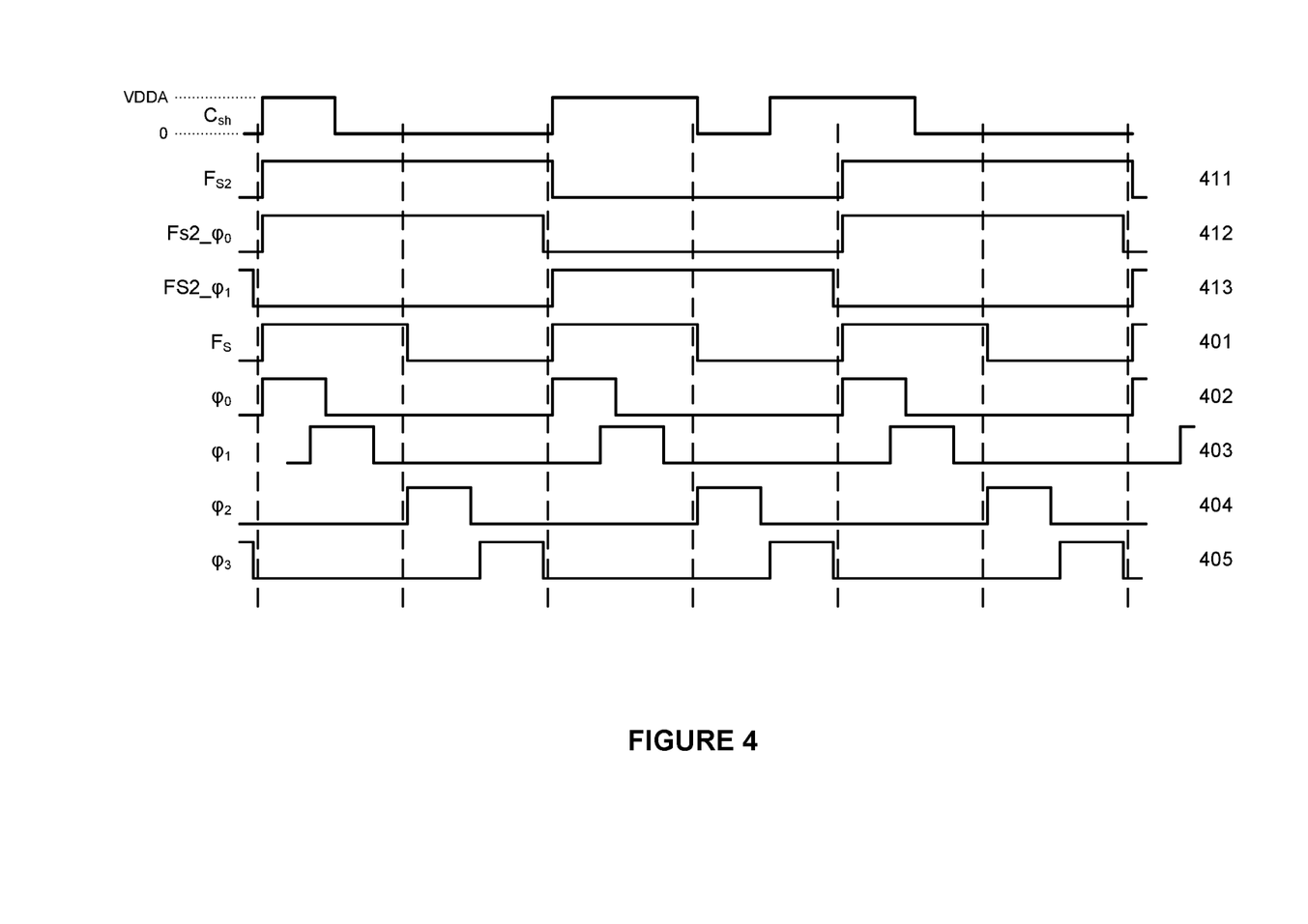
FIG. 4 is an illustration of switch control signals for the CDC of FIG. 3A, according to an embodiment.

FIG. 4 illustrates control signals for switches applied to the capacitance-to-digital converter 310 of FIG. 3A as well as the resulting voltage on the Csh node. A first control signal 401 (FS) indicates the period of a single conversion including CMOD1 and CMOD2. During the period of control signal 401, control signals 402-405, corresponding to $\varphi_0$-$\varphi_3$, control switches for applying voltages and sharing charge according to the descriptions above with regard to FIGS. 2A-J and 3A-B. An additional control signal 411 (FS2) has a frequency half of FS. FS2 may be used to derive control signals 412 and 413 corresponding respectively to FS2_$\varphi_0$ and FS2_$\varphi_1$ for alternated applying VDDA or ground during successive periods of FS.

Figure 5A:
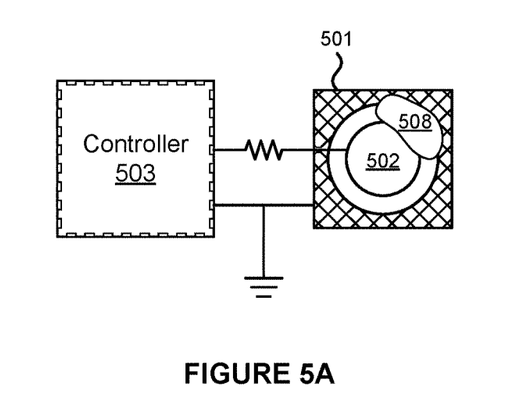
FIGS. 5A-C are illustrations of a capacitance sensor with a grounded shield and the accompanying signal from a conductive object and liquid.
Figure 5B:
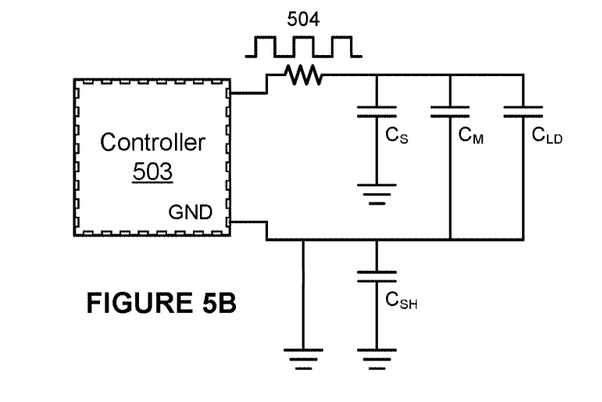

FIGS. 5A and B illustrate a capacitance sensing button 501 that includes a sensor electrode and a shield electrode similar to capacitance sensing button 101 of FIG. 1A with a liquid 508 disposed thereon. Capacitance sensing button 501 may be coupled to controller 503, which may implement a capacitance-to-digital conversion circuit (not shown). The shield electrode of capacitance sensing button 501 may be coupled to ground. FIG. 5B is a schematic representation of capacitance sensing button 501. A sensor waveform 504 may be applied to the sensor electrode of capacitance sensing button 501, creating a voltage potential across CS, CM, and a capacitance of a liquid (CLD) on capacitance sensing button 501.

Figure 5C:
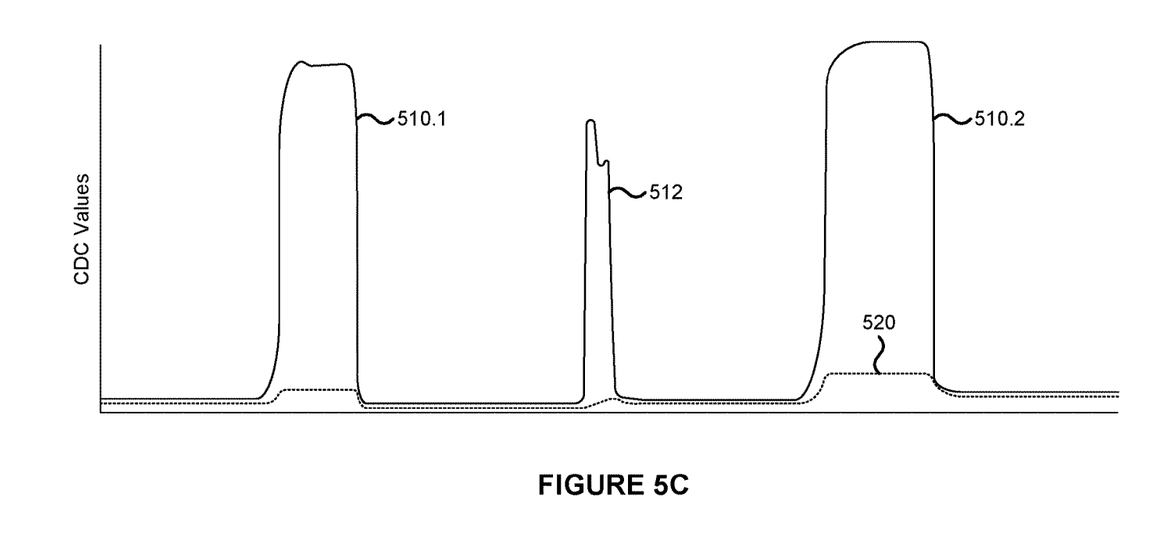

FIG. 5C illustrates an embodiment of capacitance-to-digital conversion values corresponding to proximity of a conductive object (touches) 510.1 and 510.2 as well as a water droplet 512. A baseline capacitance is also shown, corresponding to the digitized value when no conductive object or water is present on capacitance sensing button 501. With a purely grounded shield electrode, digitized capacitance values of capacitance sensing button 501 may be difficult to distinguish between a proximity of a conductive object (such as a finger touch) and a water droplet. In some embodiments, a touch panel operating in a self-capacitance sensing mode can be scanned, wherein unscanned lines can be driven with a shield signal to remove the effect of parasitic Cm, which can be applied to water droplet detection and improve sensitivity. In general, the shielding methods described herein can be used on any type of architecture that has Csh, Cm, and Cs.

Figure 6A:
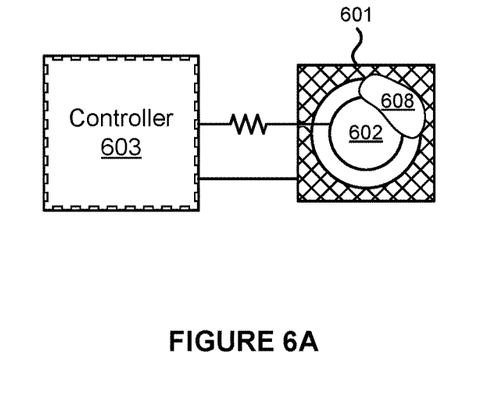
FIGS. 6A-C are illustrations of a capacitance sensor with a driven shield and the accompanying signal from a conductive object and liquid.
Figure 6B:
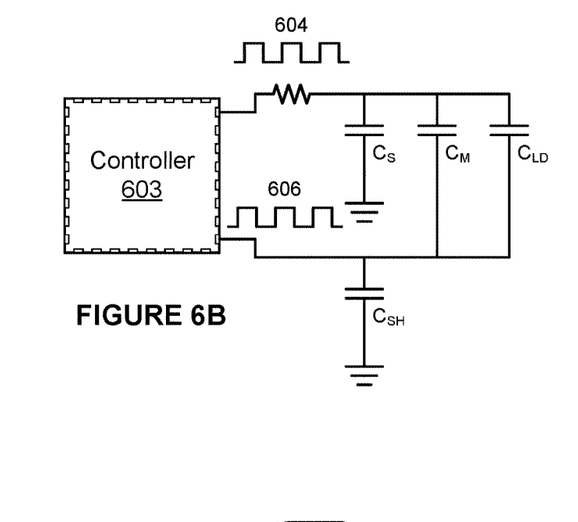

FIGS. 6A and B illustrate a capacitance sensing button 601 that includes a sensor electrode and a shield electrode similar to capacitance sensing button 101 of FIG. 1A with a liquid 608 disposed thereon. Capacitance sensing button 601 may be coupled to controller 603, which may implement a capacitance-to-digital conversion circuit (not shown). The shield electrode of capacitance sensing button 601 may be coupled to a driven signal as described above with regard to FIGS. 1B-C, 2A-J, and 3A-B. FIG. 6B is a schematic representation of capacitance sensing button 601. A sensor waveform 604 may be applied to the sensor electrode of capacitance sensing button 601, creating a voltage potential across CS. A shield waveform 606 may also be applied to the shield electrode. The shield side of CM only has to be driving to the same voltage V1 in phases $\varphi_1$ and $\varphi_3$. The voltage V1 can be any values. In one embodiment, V1=VDDA/2 and Cm gets substantially canceled. In other embodiments, V1<VDDA/2 and CM gets sampled negatively onto CMOD1 and CMOD2, and there is a negative common-mode noise drift. In other embodiments, V1>VDDA/2 and CM gets sampled positively onto CMOD1 and CMOD2, and there is a positive common-mode noise drift. In some embodiments, the shield waveform matches the sensor waveform, the voltage across CSH, CM, and CLD is zero.

Figure 6C:
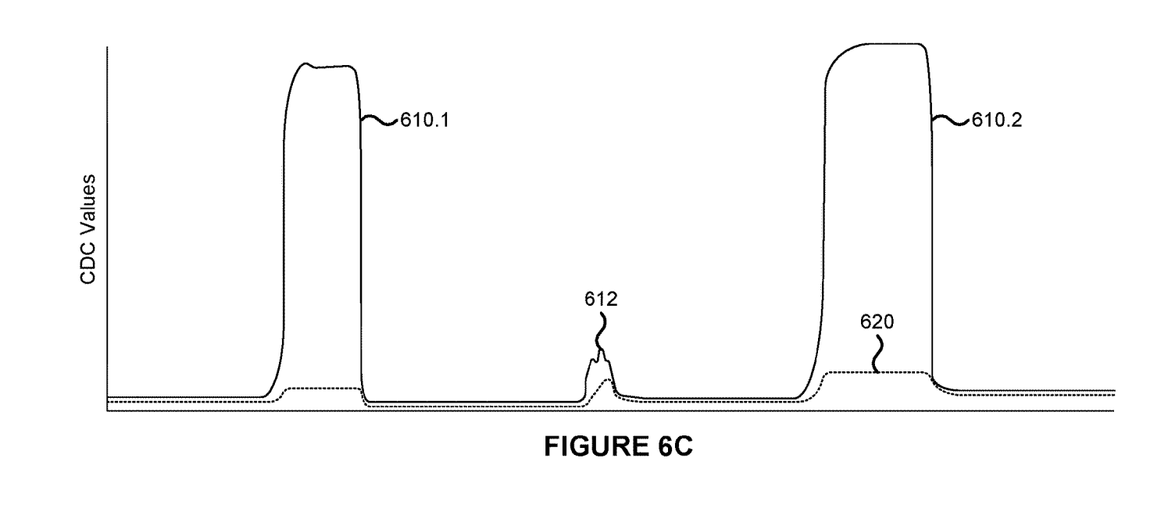

FIG. 6C illustrates an embodiment of capacitance-to-digital conversion values corresponding to proximity of a conductive object (touches) 610.1 and 610.2 as well as a water droplet 612. A baseline capacitance is also shown, corresponding to the digitized value when no conductive object or water is present on capacitance sensing button 601. With an active/driven shield electrode, digitized capacitance values of capacitance sensing button 601 may more easily be distinguished between a proximity of a conductive object (such as a finger touch) and a water droplet.

Figure 7:
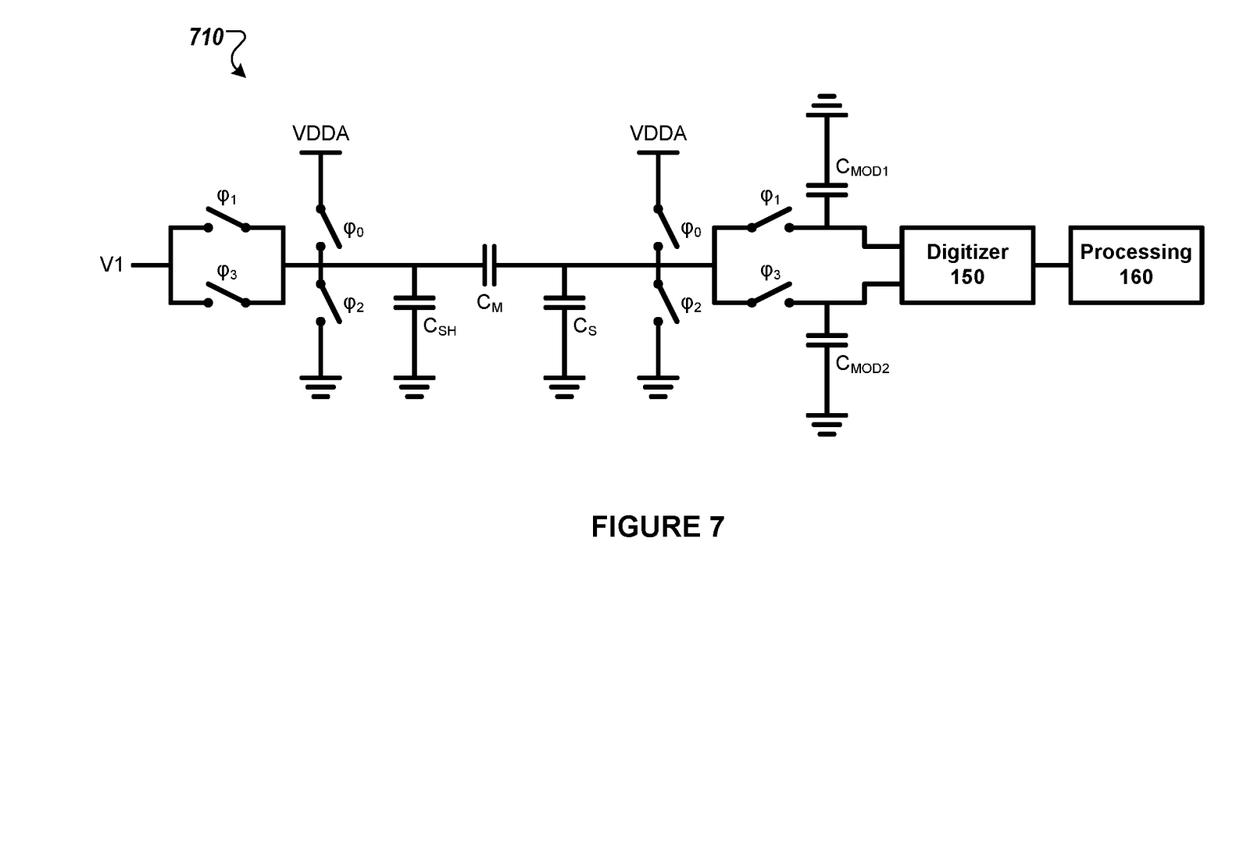
FIG. 7 is a CDC with an alternative drive voltage for the shield and sensor electrodes, according to an embodiment.

FIG. 7 illustrates an embodiment of a capacitance-to-digital converter 710, wherein the connections of the shield and sensor electrodes are coupled to a voltage, V1, other than VDDA, VDDA/2, or ground.

Figure 8:
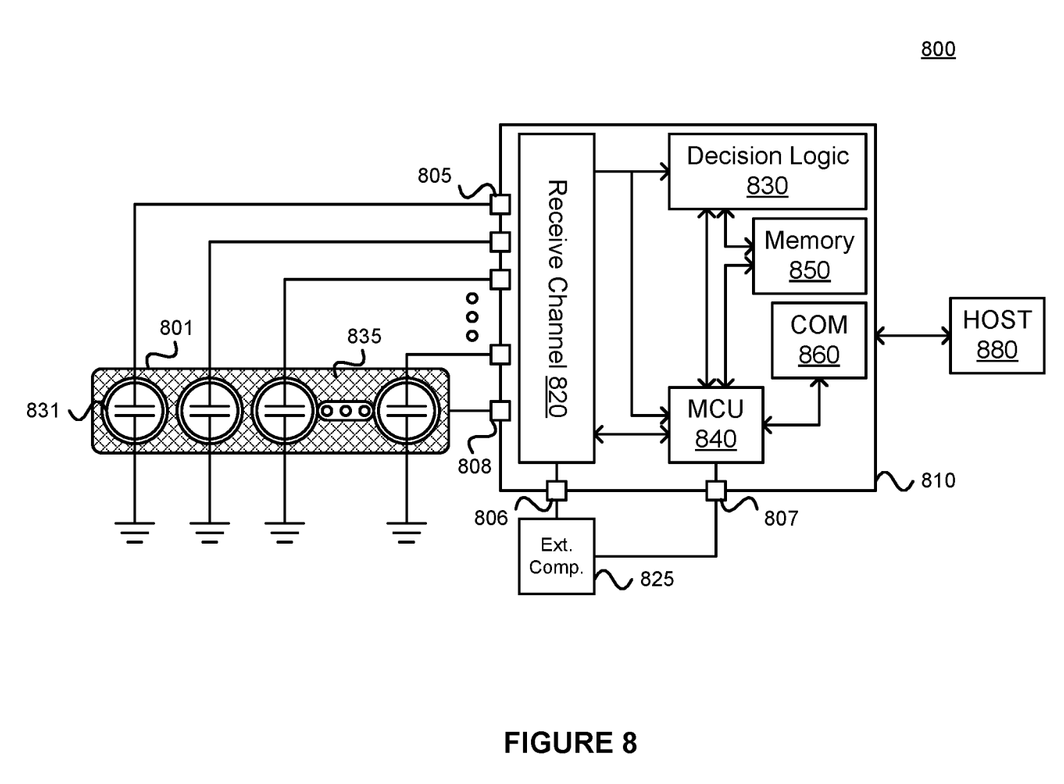
FIG. 8 is a system including at least one sensor electrode, shield electrode, and CDC, according to an embodiment.

FIG. 8 illustrates a capacitance sensing system 800 that may incorporate the proposed ratiometric capacitance to code converter of the present application. System 800 may include at least one capacitance sensing button 801 coupled to a sensing circuit 810. Capacitance sensing button 801 may be similar to capacitance sensing button 101 of FIG. 1A and include a sensor electrode 831 and a hatched plane 835. Sensor electrode 831 and hatched plane 835 may both be coupled to sensing circuit 810. In one embodiment, sensing circuit 810 may include circuitry integrated into a single device. In another embodiment, the various components of sensing circuit 810 may be distributed amongst several discrete components. For ease of explanation, sensing circuit 810 is described herein as a single integrated circuit device. In other embodiments however, the sensing circuit may include more than one integrated circuit devices. Sensor electrodes 831 may be coupled to sensing circuit 810 through inputs 805. Hatched plane 835 may be coupled to sensing circuit 810 through input 808. Inputs 805 may be coupled to inputs of a receive channel 820. Receive channel 820 may be configured to convert capacitance of capacitance sensing buttons 801 to digital values, such as with the proposed capacitance-to-digital converter. Receive channel 820 may be coupled to external components 825 as such may be necessary for the conversion. External components may be coupled to sensing circuit 810 through inputs 806. Receive channel 820 may be coupled to decision logic 830 and to MCU 840.

Decision logic 830 may be configured to process the output of receive channel 820 to determine whether a change in digital values representative of capacitance is associated with a touch or other action. Decision logic 830 may also be configured to track baseline or background capacitance values for use in touch detection. MCU 840 may be used to configure receive channel 820 based on system or application requirements. The configuration of receive channel 820 and MCU 840 may be at startup, during runtime, or based on some interrupt of host-generated commands. MCU 840 may also be configured to execute functions similar to decision logic 830 and used to make decisions regarding the presence of an object on the capacitance sensor electrodes 831 or for baseline or background capacitance tracking. MCU 840 and decision logic 830 may be coupled to memory unit 850 for storing values associated with touch detection. Memory unit 850 may also store program files and commands that are executed by MCU 840. MCU 840 may also be coupled to external components, as necessary, through inputs 807. MCU 840 may also be coupled to communication interface 860, which may be used to output status to host 880 or another external device. Communication interface 860 may also be configured to receive commands from an external device.

The embodiments described herein may be used in various designs of mutual-capacitance sensing arrays of the capacitance sensing system, or in self-capacitance sensing arrays. In one embodiment, the capacitance sensing system detects multiple sense elements that are activated in the array, and can analyze a signal pattern on the neighboring sense elements to separate noise from actual signal. The embodiments described herein are not tied to a particular capacitive sensing solution and can be used as well with other sensing solutions, including optical sensing solutions, as would be appreciated by one of ordinary skill in the art having the benefit of this disclosure.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "encrypting," "decrypting," "storing," "providing," "deriving," "obtaining," "receiving," "authenticating," "deleting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments described herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A self capacitance measurement circuit comprising:
   a sensor electrode;
   a shield electrode;
   a switch matrix for coupling the sensor electrode and the shield electrode to a plurality of reference voltages and to a capacitance digitizer circuit, the reference voltages comprising a drive voltage and a ground potential, wherein in a first phase, the sensor electrode and the shield electrode are coupled to a drive voltage, in a second phase, the sensor electrode is coupled to a first modulation capacitor and the shield electrode is coupled to the ground potential, in a third phase, the sensor electrode and the shield electrode are coupled to the ground potential, and in a fourth phase, the sensor electrode is coupled to a second modulation capacitor and the shield electrode is coupled to the ground potential, and wherein the digitizer circuit is coupled to the first and second modulation capacitors and is for providing a digital output representative of the capacitance of the sensor electrode to ground.

2. The self capacitance measurement circuit of 1, wherein the digitizer circuit is coupled to a processing circuit, the processing circuit for detecting the presence of a conductive object on the sensor electrode based on the digital output.

3. The self capacitance measurement circuit of 1, wherein the first and second modulation capacitors have capacitance values at least two orders of magnitude greater than the capacitance of the sensor electrode to ground.

4. The self capacitance measurement circuit of 1, wherein the shield electrode is disposed such that it substantially surrounds the sensor electrode.

5. The self capacitance measurement circuit of 1, wherein, in the second phase, the first modulation capacitor removes charge from capacitor formed by the sensor electrode.

6. The self capacitance measurement circuit of 1, wherein, in the fourth phase, the second modulation capacitor adds charge from capacitor formed by the sensor electrode.

7. The self capacitance measurement circuit of 1, wherein, in the second and fourth phases, a mutual capacitance formed between the sensor electrode and the shield electrode removes charge from the first and second modulation capacitors, respectively.

8. A method for converting a capacitance on a sensor electrode to a digital value, the method comprising:

in a first phase, coupling the sensor electrode and a shield electrode to a drive voltage;

in a second phase, coupling the sensor electrode is coupled to a first modulation capacitor and coupling the shield electrode to the ground potential;

in a third phase, coupling the sensor electrode and the shield electrode to the ground potential; and in a fourth phase, coupling the sensor electrode to a second modulation capacitor and coupling the shield electrode is coupled to the ground potential, wherein the first and second modulation capacitors are coupled to a digitizer circuit, the digitizer circuit having an output to a processing circuit.

9. The method of claim 8, wherein the processing circuit is for detecting the presence of a conductive object on the sensor electrode based on the output of the digitizer circuit.

10. The method of claim 8, wherein the first and second modulation capacitors have capacitance values at least two orders of magnitude greater than the capacitance of the sensor electrode to ground.

11. The method of claim 8, wherein the shield electrode is disposed such that it substantially surrounds the sensor electrode.

12. The method of claim 8, wherein, in the second phase, the first modulation capacitor removes charge from capacitor formed by the sensor electrode.

13. The method of claim 8, wherein, in the fourth phase, the second modulation capacitor adds charge from capacitor formed by the sensor electrode.

14. The method of claim 8, wherein, in the second and fourth phases, a mutual capacitance formed between the sensor electrode and the shield electrode removes charge from the first and second modulation capacitors, respectively.

15. A capacitance measurement system comprising:
a sensor electrode;
a shield electrode; and
a sensing circuit, the sensing circuit comprising:
a plurality of inputs/outputs (IOs) coupled to the sensor electrode and the shield electrode;
a receive channel, the receive channel including a switch matrix for coupling the sensor electrode and the shield electrode to a plurality of voltage potentials and a plurality of modulation capacitors, wherein the switch matrix is for:
in a first phase, coupling the sensor electrode and the shield electrode to a drive voltage;
in a second phase, coupling the sensor electrode is coupled to a first modulation capacitor and coupling the shield electrode to the ground potential;
in a third phase, coupling the sensor electrode and the shield electrode to the ground potential; and
in a fourth phase, coupling the sensor electrode to a second modulation capacitor and coupling the shield electrode is coupled to the ground potential, wherein
the first and second modulation capacitors are coupled to a digitizer circuit, the digitizer circuit having an output to a processing circuit.

16. The capacitance measurement system of claim 15, wherein the processing circuit is for detecting the presence of a conductive object on the sensor electrode based on the output of the digitizer circuit.

17. The capacitance measurement system of claim 15, wherein the first and second modulation capacitors have capacitance values at least two orders of magnitude greater than the capacitance of the sensor electrode to ground.

18. The capacitance measurement system of claim 15, wherein, in the second phase, the first modulation capacitor removes charge from capacitor formed by the sensor electrode.

19. The capacitance measurement system of claim 15, wherein, in the fourth phase, the second modulation capacitor adds charge from capacitor formed by the sensor electrode.

20. The capacitance measurement system of claim 15, wherein, in the second and fourth phases, a mutual capacitance formed between the sensor electrode and the shield electrode removes charge from the first and second modulation capacitors, respectively.

* * * * *